United States Patent
Perez Lara et al.

(10) Patent No.: US 12,261,615 B2
(45) Date of Patent: Mar. 25, 2025

(54) ATTENUATING CONTINUOUS WAVE SPURS ASSOCIATED WITH A RECEIVER

(71) Applicant: VIAVI Solutions Inc., Chandler, AZ (US)

(72) Inventors: Pablo Perez Lara, St Neots (GB); John Dominic Wilson, Welwyn Garden City (GB)

(73) Assignee: VIAVI Solutions Inc., Chandler, AZ (US)

( * ) Notice: Subject to any disclaimer, the term of this patent is extended or adjusted under 35 U.S.C. 154(b) by 169 days.

(21) Appl. No.: 18/160,741

(22) Filed: Jan. 27, 2023

(65) Prior Publication Data

US 2024/0259027 A1 Aug. 1, 2024

(51) Int. Cl.
*H03M 1/06* (2006.01)

(52) U.S. Cl.
CPC .................. *H03M 1/0604* (2013.01)

(58) Field of Classification Search
CPC ...... H03M 1/0604; H04B 1/10; H04B 1/0007
See application file for complete search history.

(56) References Cited

U.S. PATENT DOCUMENTS

| | | | | |
|---|---|---|---|---|
| 5,389,927 A * | 2/1995 | Turney | ................. | H03M 1/182 341/138 |
| 6,288,659 B1 * | 9/2001 | Jalali | .................. | H03M 1/1215 341/137 |
| 6,317,071 B1 * | 11/2001 | Kolsrud | ................. | H03M 1/20 341/120 |
| 6,369,727 B1 * | 4/2002 | Vincze | ...................... | G06J 1/00 341/131 |
| 8,193,958 B2 * | 6/2012 | Tahara | ............. | G11B 20/10194 341/122 |
| 8,451,918 B1 * | 5/2013 | Cheng | .................... | H04K 3/228 370/208 |
| 9,628,122 B1 * | 4/2017 | Clark | ................... | H04J 11/0066 |
| 10,127,487 B1 * | 11/2018 | Mendel | ............. | G06K 19/07749 |
| 10,186,249 B1 * | 1/2019 | Lan | .................. | G10K 11/17853 |
| 10,819,353 B1 * | 10/2020 | Monk | ....................... | H03L 7/23 |
| 2007/0098089 A1 * | 5/2007 | Li | .......................... | H03J 1/0091 348/E5.097 |
| 2010/0214145 A1 * | 8/2010 | Narasimhan | ........ | H03M 1/1042 341/155 |
| 2013/0021018 A1 * | 1/2013 | Venkataraman | ...... | H03M 3/494 324/123 R |
| 2015/0180416 A1 | 6/2015 | Fernandez | | |
| 2015/0200649 A1 * | 7/2015 | Trager | ............... | H03H 17/0628 341/61 |
| 2016/0095055 A1 * | 3/2016 | Sarrigeorgidis | ....... | H04B 1/525 370/311 |
| 2017/0359136 A1 | 12/2017 | Dufrene et al. | | |
| 2023/0417799 A1 * | 12/2023 | Park | ..................... | G01R 31/001 |

OTHER PUBLICATIONS

Extended European Search Report for European Application No. EP241535319 dated Jun. 10, 2024, 8 pages.

* cited by examiner

*Primary Examiner* — Lam T Mai
(74) *Attorney, Agent, or Firm* — Harrity & Harrity, LLP

(57) ABSTRACT

In some implementations, a receiver may obtain a digitized output of a radio frequency (RF) analog-to-digital-converter (ADC) of the receiver. The receiver may apply a spur cancellation to the digitized output of the RF ADC to attenuate one or more continuous wave spurs from the digitized output of the RF ADC, wherein the spur cancellation is based on a frequency planning with coherent averaging.

20 Claims, 11 Drawing Sheets

Receiver 300

| $P_{tone}/N_{sc}$ (dB) | | 0 | | -10 | | -20 | |
|---|---|---|---|---|---|---|---|
| $F_S/D$ (MSPS) | $N$ | $\alpha=\log_2 L$ | $\tau_L(s)$ | $\alpha=\log_2 L$ | $\tau_L(s)$ | $\alpha=\log_2 L$ | $\tau_L(s)$ |
| 1500 | 64 | 21 | 0.089 | 24 | 0.7 | 28 | 11 |
| 500 | 32 | 22 | 0.27 | 25 | 2.15 | 29 | 34 |

FIG. 6

ATTENUATING CONTINUOUS WAVE SPURS ASSOCIATED WITH A RECEIVER

BACKGROUND

A network test device may be used by network equipment manufacturers for function, system integration, capacity, and stress testing and emulation of a plurality of mobile devices, across multiple cells, to set up and test network nodes, such as fourth-generation (4G) and fifth generation (5G) base stations. A network test device may deliver voice, data, realistic mobility models, and 4G/5G core emulation, thereby providing a comprehensive validation solution. A network test device may ensure that users in a network are obtaining adequate quality of service. A network test device may ensure that the network is satisfying latency and round-trip time requirements for voice and time-critical applications.

SUMMARY

In some implementations, a method includes obtaining, by a receiver, a digitized output of a radio frequency (RF) analog-to-digital-converter (ADC) of the receiver; and applying, by the receiver, a spur cancellation to the digitized output of the RF ADC to attenuate one or more continuous wave spurs from the digitized output of the RF ADC, wherein the spur cancellation is based on a frequency planning with coherent averaging.

In some implementations, a device includes one or more components configured to: obtain a digitized output of an RF ADC of the device; and apply a spur cancellation to the digitized output of the RF ADC to attenuate one or more continuous wave spurs from the digitized output of the RF ADC, wherein the spur cancellation is based on a frequency planning with coherent averaging.

In some implementations, a non-transitory computer-readable medium storing a set of instructions includes one or more instructions that, when executed by one or more processors of a receiver, cause the receiver to: obtain a digitized output of an RF ADC of the receiver; and apply a spur cancellation to the digitized output of the RF ADC to attenuate one or more continuous wave spurs from the digitized output of the RF ADC, wherein the spur cancellation is based on a frequency planning with coherent averaging.

BRIEF DESCRIPTION OF THE DRAWINGS

FIG. 6 is a diagram of an example implementation associated with calculating a coherent average length and a number of residual tones.

DETAILED DESCRIPTION

The following detailed description of example implementations refers to the accompanying drawings. The same reference numbers in different drawings may identify the same or similar elements.

A network test device may include a receiver (or radio) to receive signals. The receiver may include a radio frequency (RF) analog-to-digital-converter (ADC). An output of the RF ADC x[n] may be written as a function of its input x (t) as:

$$x[n] = x_i(nT_S) \qquad \text{Eq. 1}$$

where $T_S = 1/F_S$ and $F_S$ is the sampling frequency. Equation 1 may be rewritten as follows:

$$x[n] = x_m(nT_S) \qquad \text{Eq. 2}$$

$$x_m(t) = x_i(t) \sum_{k=-\infty}^{\infty} \delta\,(t - kT_S) \qquad \text{Eq. 3}$$

Equation 3 may represent the sampling process as the multiplication of $x_i(t)$ with an impulse train. In the frequency domain, Equation 3 may be written as:

$$X_m(f) = F_S \sum_{k=-\infty}^{\infty} X_i(f - kF_S) \qquad \text{Eq. 1}$$

where $X_m(f)$ and $X_i(f)$ are the Fourier transforms of $x_m(t)$ and $x_i(t)$, respectively. Equation 4 may be equivalent to mixing x(t) with a plurality of possible harmonics of $F_S$ (e.g., all of the possible harmonics of $F_S$). An aliasing effect may be exploited to downconvert signals outside the first Nyquist zone in a wideband RF receiver.

Figure 1:
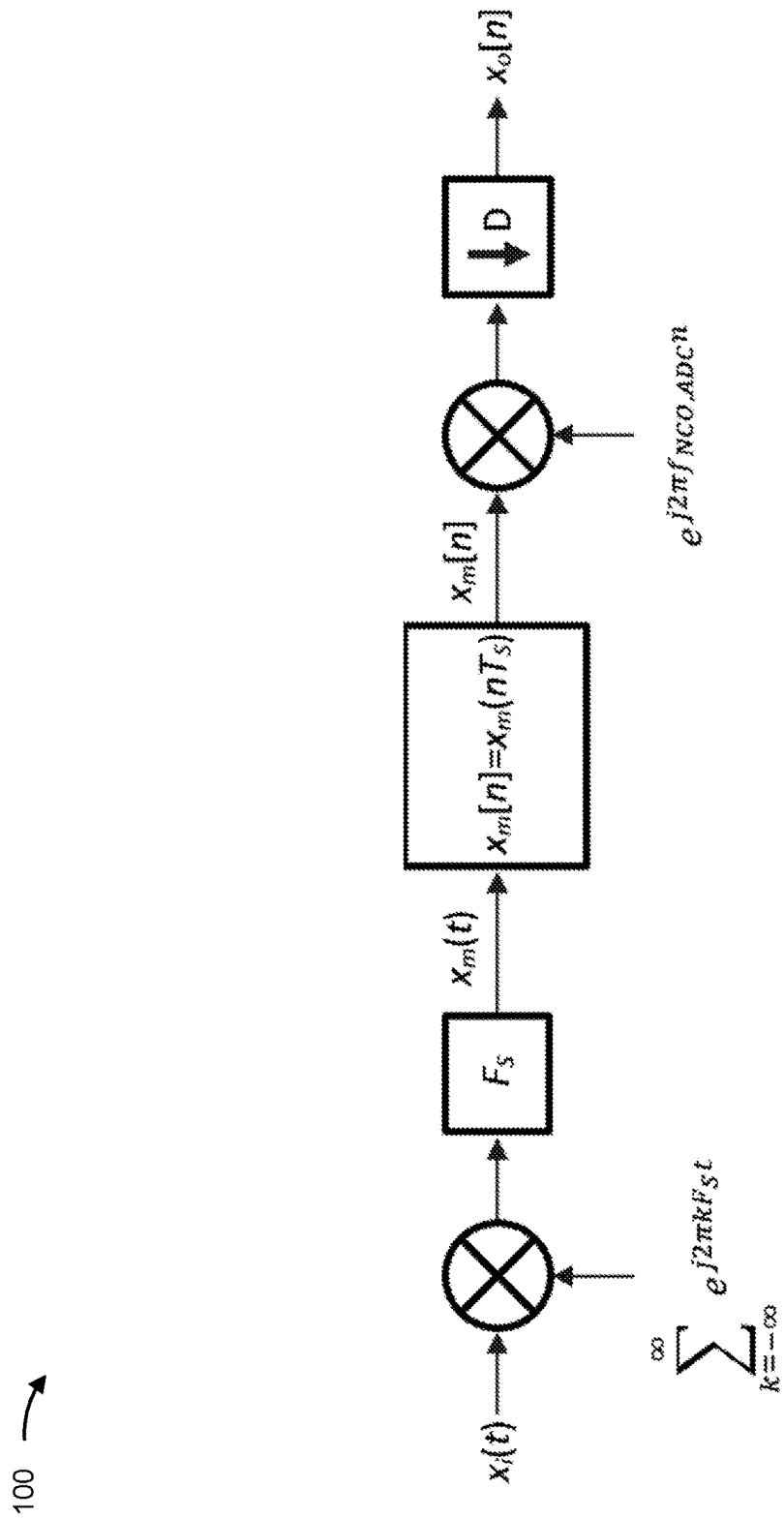
FIG. 1 is a diagram of an example implementation associated with a radio frequency (RF) analog-to-digital-converter (ADC) as a sampling mixer.

FIG. 1 is a diagram of an example implementation 100 associated with an RF ADC as a sampling mixer. The RF ADC may be included in a network test device, which is described in more detail below in connection with FIG. 9 and FIG. 10.

As shown in FIG. 1, in the RF ADC, an input signal $x_i(t)$ may be mixed, using a mixer, with a plurality of possible harmonics of $F_S$, which may result in a signal $x_m(t)$. The input signal $x_i(t)$ may be mixed with $$\sum\nolimits_{k=-\infty}^{\infty}e^{j2\pi kF_{s}t}.$$

Further, $x_m[n]=x_m(nT_S)$, which may result in a signal $X_m(n)$. The signal $x_m(n)$ may be mixed with $e^{j2\pi f_{NCO,ADC}n}$, and a signal down-conversion may result in a signal $x_o[n]$. The RF ADC may be capable of digitizing RF signals directly by supporting a relatively high $F_S$ in a gigabits per second (GSPS) range, and may include a numerically controlled oscillator (NCO) (e.g., frequency $f_{NCO,ADC}$) for digital down-conversion followed by a decimation stage by a factor D to reduce the sample rate from $F_S$ to a lower rate $F_S/D$ more suitable for a downstream device, such as a field programmable gate array (FPGA).

As indicated above, FIG. 1 is provided as an example. Other examples may differ from what is described with regard to FIG. 1. The number and arrangement of devices shown in FIG. 1 are provided as an example. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) shown in FIG. 1 may perform one or more functions described as being performed by another set of devices shown in FIG. 1.

Due to a relatively large bandwidth of an RF ADC and due to the behavior of the RF ADC as a sampling mixer, a digitized output of the RF ADC may exhibit spurs. A spur may be an unwanted signal (e.g., a signal spike) in the digitized output of the RF ADC. The spurs may be caused by a direct current (DC) offset of the RF ADC, and the coupling of the reference clock of the phase-locked loop (PLL) of the RF ADC $f_{CLK1}$, the clock used by the interleaved cores of the RF ADC $f_{CLK2}$, and the local oscillator (LO) of the analog frequency conversion stage used in the RF transmitter and receiver ($f_{LO,TX}$ and $f_{LO,RX}$, respectively), as well as their harmonics. The presence of spurs may be exacerbated in high density multiple transceiver designs, which may require multiple LOs tuned at different frequencies and suffer from worse coupling due to layout and mechanical constraints.

Traditional receiver architectures, such as zero or low intermediate frequency (IF) receivers, which may use relatively slower RF ADCs, may not suffer from this relatively large presence of spurs because such RF ADCs may be less sensitive to the leakage of high frequency signals, and unwanted signals may be more easily removed by filtering.

Figure 2:
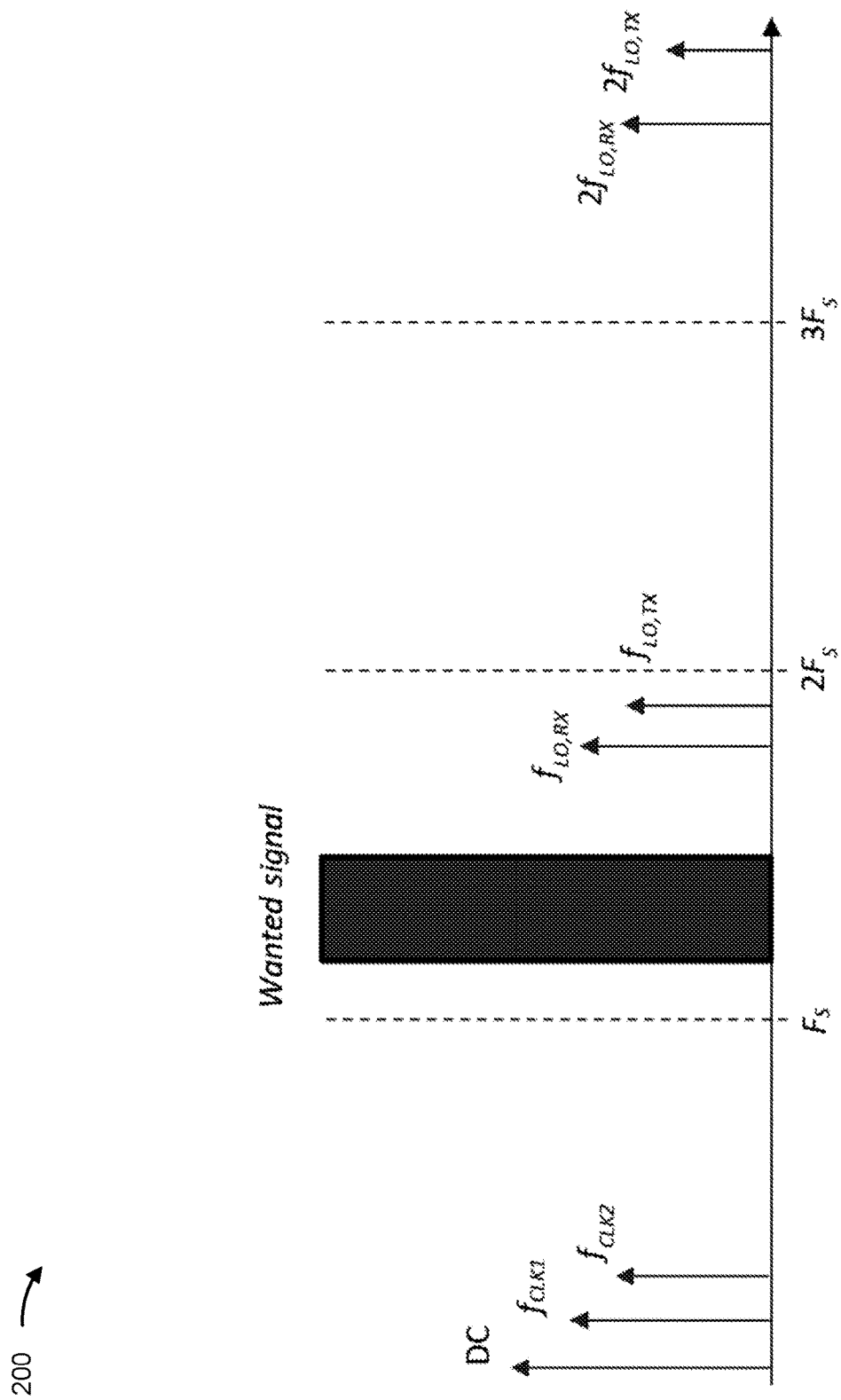
FIG. 2 is a diagram of an example implementation associated with wanted and unwanted signals digitized by an RF ADC of a receiver.

FIG. 2 is a diagram of an example implementation 200 associated with wanted and unwanted signals digitized by an RF ADC of a receiver. The RF ADC of the receiver may be included in a network test device, which is described in more detail below in connection with FIG. 9 and FIG. 10.

As shown in FIG. 2, a wanted signal may be observed at an output of an RF ADC. Various unwanted continuous wave signals may also be observed at the output of the RF ADC. A first unwanted continuous wave signal may include $|m \cdot f_{LO,TX}(i) - n \cdot F_S| - f_{NCO,ADC}$ (i=1 ... Number of transmit LOs), which may correspond to an alias of a harmonic of any of the transmit LOs, down-converted by the NCO of the RF ADC. A second unwanted continuous wave signal may include $|m \cdot f_{LO,RX}(i) - n \cdot F_S| f_{NCO,ADC}$ (i=1 ... Number of receive LOs), which may correspond to an alias of a harmonic of any of the receive LOs, down-converted by the NCO of the RF ADC. A third unwanted continuous wave signal may include $|m \cdot f_{CLK1} - n \cdot F_S| - f_{NCO,ADC}$, which may correspond to an alias of a harmonic of the reference of the RF ADC PLL $f_{CLK1}$ (e.g., $f_{CLK1}$=750 MHz), down-converted by the NCO of the RF ADC. A fourth unwanted continuous wave signal may include $|m \cdot f_{CLK2} - n \cdot F_S| f_{NCO,ADC}$, which may correspond to an alias of a harmonic of the $f_{CLK2}$ clock used by the interleaved cores of the RF ADC (e.g., $f_{CLK2}$=1500 MHZ), down-converted by the NCO of the RF ADC. A fifth unwanted continuous wave signal may include $f_{NCO,ADC}$, which may correspond to a residual DC component of the RF ADC, up converted by its NCO. Further, $F_S$ and $f_{NCO,ADC}$ are the sampling and NCO frequencies of the RF ADC, respectively. E.g., $F_S$=6000 mega samples per second (MSPS).

In a traditional approach, removing these spurs may require a complicated solution using multiple signal cancellation blocks that are tuned independently, and knowledge of a plurality of LO frequencies (e.g., all LO frequencies) configured on an RF board.

As indicated above, FIG. 2 is provided as an example. Other examples may differ from what is described with regard to FIG. 2.

An RF ADC, which may be used in a receiver of a network test device, may allow for direct digitization of RF signals. The RF ADC may simplify a wireless receiver by reducing the number of analog frequency conversion stages, as compared with traditional receiver architectures such as zero or low intermediate frequency (IF) receiver architectures. However, due to the relatively large bandwidth of the RF ADC and aliasing effects, unwanted signals coupling into the RF ADC, such as clocks, LOs and corresponding harmonics, may fold back and overlap with the sampled wanted signal, causing desensitization. The unwanted signals overlapping with the sampled wanted signal may be referred to as spurs. Spurs may be worse in high density, multi-channel transceivers due to increased coupling and the use of multiple LOs.

In some implementations, a spur (or multiple spurs) associated with a receiver, such as a wireless receiver included in a network test device, may be attenuated using digital signal processing. The spur may be a continuous wave spur. The receiver may obtain a digitized output of the RF ADC. The receiver may apply a spur cancellation to the digitized output of the RF ADC to attenuate the spur from the digitized output of the RF ADC, where the spur cancellation may be based on a frequency planning with coherent averaging. The frequency planning may be for a first reference clock, a second reference clock, a transmit LO (e.g., an LO of an RF transmitter), a receive LO (e.g., an LO of an RF receiver), where the RF receiver may be the receiver included in the network test device, and an NCO of the RF ADC that causes corresponding signals to be integer multiples of a frequency bin, where the frequency bin may be based on a sampling frequency, an ADC decimation factor, and an integer number. The spur may become a periodic signal based on the frequency planning, and the spur cancellation may be applied based on the periodic signal without information regarding exact frequency values of the first reference clock, the second reference clock, the transmit LO, the receive LO, and the NCO of the RF ADC. Further, a frequency error resulting from the frequency planning may be compensated by a digital frequency conversion using an NCO frequency value.

In some implementations, a shift register of the receiver may be loaded with a matrix of samples, and the samples may be processed in parallel using the coherent averaging. In an FPGA, the shift register may act as a registered multiplexer for sample signals, which reduces the fanout of the sample signals going into the moving average filters, and which may allow the FPGA to meet timing requirements. A coherent averaging block of the receiver may include a matrix of coherent average filters, where each coherent average filter may implement an average of a defined quantity of samples using an accumulator and the accumulator is reset every defined quantity of output samples for time-domain correction information to be obtained. An update correction signal may be asserted based on the time-domain correction information being available, where the time-domain correction information may be stored in a circular buffer of the receiver.

In some implementations, attenuating the spur using frequency planning and a coherent averaging spur cancellation technique may allow an entire operating range of the RF ADC to be used and may allow for the relaxation of isolation requirements. In contrast, conventional solutions may involve using the RF ADC only at frequency bands that are clean of spurs, which may require a complex hardware design which translates a receiver input frequency to one of these frequency bands. Further, in these conventional solutions, the density of integration may be limited by the requirement for relatively high isolation between an LO and an RF ADC input.

Figure 3:
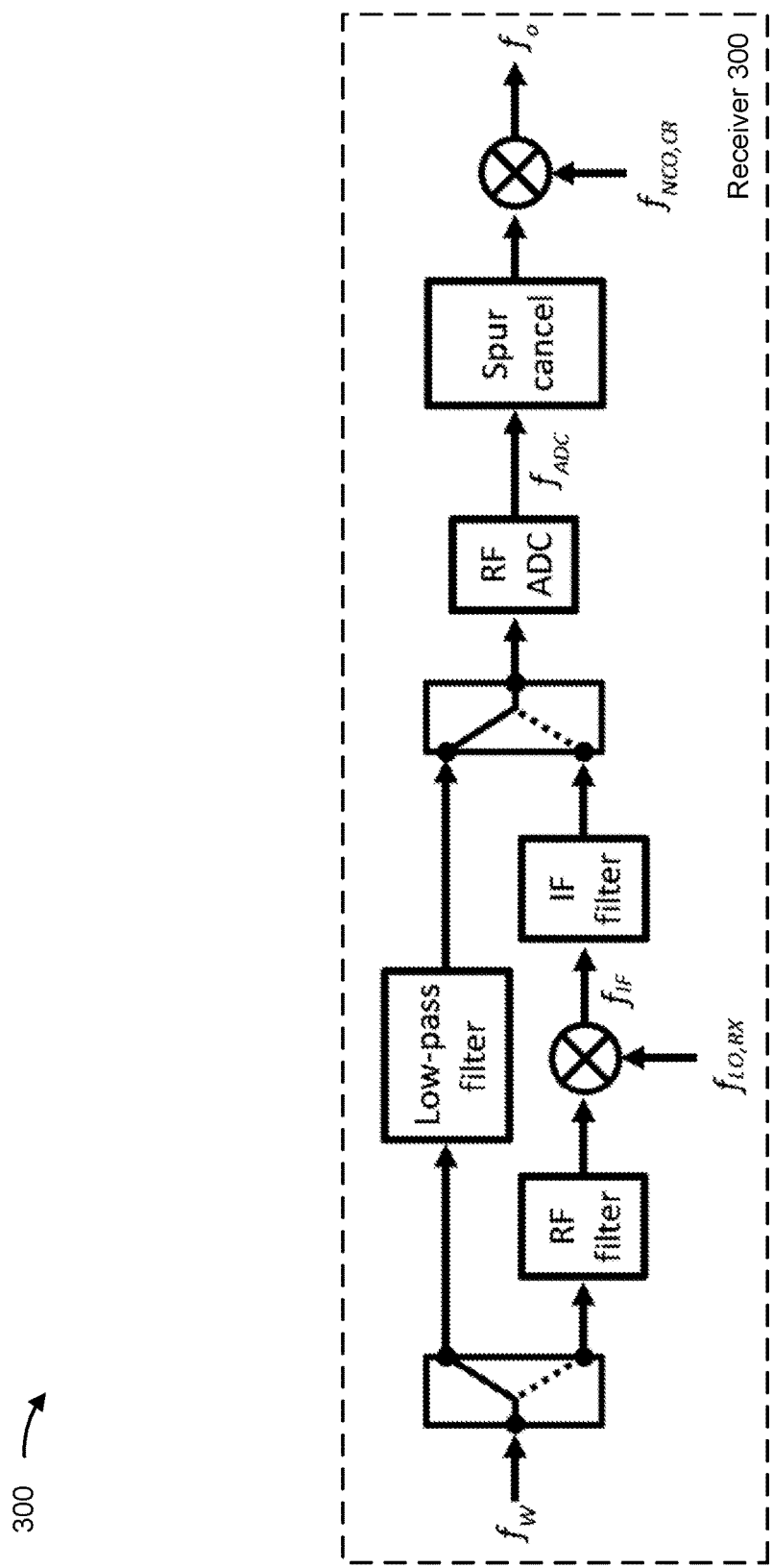
FIG. 3 is a diagram of an example implementation associated with a receiver that incorporates a spur cancellation block.

FIG. 3 is a diagram of an example implementation associated with a receiver 300 that incorporates a spur cancellation block. The receiver 300 may be included in a network test device, which is described in more detail below in connection with FIG. 9 and FIG. 10.

In some implementations, continuous wave spurs observed at the output of the RF ADC of the receiver 300 may be attenuated using a combination of frequency planning and a coherent averaging spur cancellation technique. Frequency planning and spur cancellation based on coherent averaging may be used in lieu of using multiple signal cancellation blocks and knowledge of a plurality of LO frequencies configured on an RF board.

In some implementations, regarding frequency planning, when $f_{LO,TX}(i)$, $f_{LO,RX}(i)$, $f_{CLK1}$, $f_{CLK2}$, and $f_{NCO,ADC}$ are all integer multiples of $\Delta f$ given by:

$$\Delta f = \frac{F_S}{D \cdot N} \quad \text{Eq. 2}$$

where D is an RF ADC decimation factor and N is an integer number, then spur frequencies may also become a multiple of $\Delta f$. Spur signals may become a periodic signal of period $T=1/\Delta f$. As a result, an efficient spur cancellation technique may be based on coherent averaging, which may not require knowledge of the exact values of $f_{NCO,ADC}$, $f_{LO,TX}(i)$ and $f_{LO,RX}(i)$. The frequency error resulting from this frequency planning may be compensated by digital frequency conversion using an NCO $f_{NCO,CR}$.

As shown in FIG. 3, in the receiver 300 that incorporates the spur cancellation block, in a direct sampling band, at wanted signal frequencies $f_W$ within the first Nyquist window of the RF ADC, a signal may pass through a low pass filter (e.g., a low pass anti-aliasing filter), and then into the RF ADC. In an IF band, at wanted signal frequencies $f_W$ outside the first Nyquist window of the RF ADC, the signal may be up converted or down-converted to an intermediate frequency $f_{IF}$ using an analog mixer and an LO $f_{LO,RX}$. The intermediate frequency fir may go through an anti-aliasing IF filter, and then may be digitized by the RF ADC. An output of the RF ADC may be a signal associated with $f_{ADC}$, which then may be provided to a spur cancellation block.

In some implementations, in the direct sampling band, an RF ADC NCO may ideally operate at $f_{NCO,ADC}=f_W$, so that $f_{ADC}=0$ Hz. Since $f_{NCO,ADC}$ needs to be a multiple of $\Delta f$.

$$f_{NCO,ADC} = \Delta f \cdot \text{round}\left(\frac{f_W}{\Delta f}\right) \quad \text{Eq. 3}$$

which may yield:

$$f_{ADC} = f_W - f_{NCO,ADC} \quad \text{Eq. 4}$$

At the output of the RF ADC. Generally, $f_{ADC} \neq 0$ Hz, and $f_{NCO,CR}$ may correct for this as follows:

$$f_{NCO,CR} = f_{ADC} \quad \text{Eq. 5}$$

with $$|f_{NCO,CR}| - |f_{ADC}| \leq \frac{\Delta f}{2} \quad \text{Eq. 6}$$

In some implementations, in the IF band, ideally $f_{LO,RX}$ is set so that $f_W$ is translated to $f_{IF}$. However, $f_{LO,RX}$ must be an integer multiple of $\Delta f$. The frequency error in the IF band should be minimized, especially in wideband applications, to avoid wastage of the passband of the IF filter of the receiver 300. In order to minimize the frequency error in the IF band, $f_{LO,RX}$ may be calculated as follows:

$$f_{LO,RX} = \Delta f \cdot \text{round}\left(\frac{f_W + f_{IF}}{\Delta f}\right) \quad \text{Eq. 7}$$

which may result in a different $f_{IF}'$ frequency fir given by:

$$f_{IF}' = f_{LO,RX} - f_W \quad \text{Eq. 8}$$

and $$|f_{IF}' - f_{IF}| \leq \frac{\Delta f}{2} \quad \text{Eq. 9}$$

Generally, setting $f_{NCO,ADC}=f_{IF}'$ may not be possible because fir may not be a multiple of $\Delta f$. Instead:

$$f_{NCO,ADC} = \Delta f \cdot \text{round}\left(\frac{f_{IF}'}{\Delta f}\right) \quad \text{Eq. 10}$$

and $f_{NCO,CR}$ may be calculated using Equations 7 and 8, as in the direct sampling band.

In some implementations, the value of N may be considered carefully. A relatively large N may mean a smaller $\Delta f$, which may decrease the frequency error in Equation 9 and Equation 12 to minimize wastage of the passband available at different stages of the receiver 300. However, a smaller N may be convenient to reduce the usage of signal processing resources.

As an example, for $F_S/D=500$ MSPS and 1500 MSPS, respectively, N=32 and 64 produce $\Delta f=15.625$ MHz and 23.4375 MHz, which yield acceptable maximum frequency offsets of 7.8125 MHz and 11.71875 MHz, respectively. Smaller N values may be used when the receiver 300 design tolerates larger frequency offsets.

As indicated above, FIG. 3 is provided as an example. Other examples may differ from what is described with regard to FIG. 3. The number and arrangement of devices shown in FIG. 3 are provided as an example. In practice, there may be additional devices, fewer devices, different devices, or differently arranged devices than those shown in FIG. 3. Furthermore, two or more devices shown in FIG. 3 may be implemented within a single device, or a single device shown in FIG. 3 may be implemented as multiple, distributed devices. Additionally, or alternatively, a set of devices (e.g., one or more devices) shown in FIG. 3 may perform one or more functions described as being performed by another set of devices shown in FIG. 3.

Figure 4:
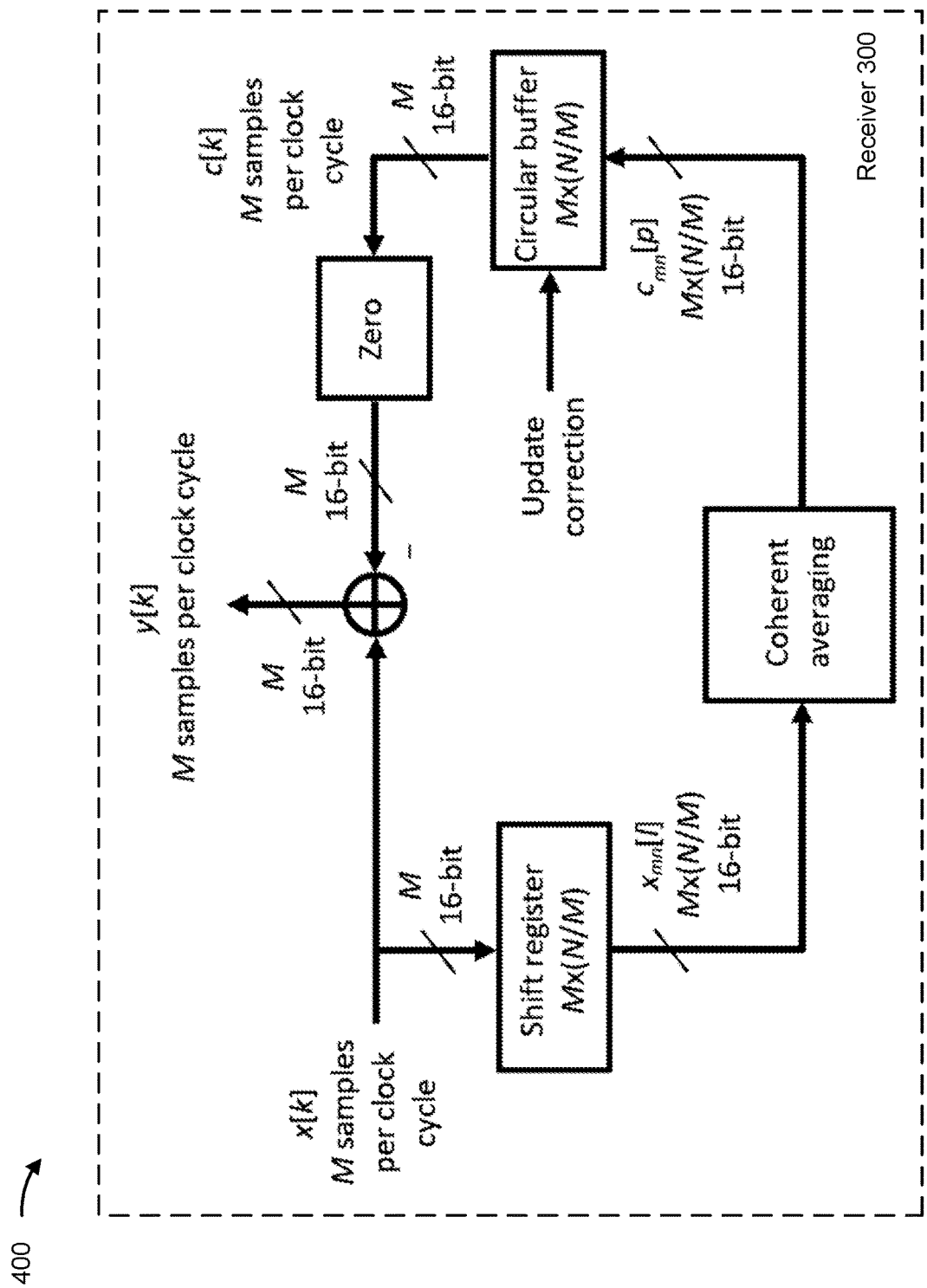
FIG. 4 is a diagram of an example implementation associated with a coherent averaging-based spur cancellation system.

FIG. 4 is a diagram of an example implementation 400 associated with a coherent averaging-based spur cancellation system. The coherent averaging-based spur cancellation system may be included in the receiver (e.g., receiver 300) of the network test device, which is described in more detail below in connection with FIG. 9 and FIG. 10.

As shown in FIG. 4, in the coherent averaging-based spur cancellation system, an input signal may be in arrays x[k] of M samples per clock cycle, which may allow for parallel processing to be applied to relatively large signal bandwidths. In this way, the maximum clock frequency of a digital processing device, such as an FPGA, may not be exceeded. For example, M=8 and M=2 for $F_S/D$=1500 MSPS and 500 MSPS, respectively. An array index k may be a value between 0 and (N/M-1) and may repeat periodically.

In some implementations, when an input shift register is loaded with a matrix of M×(N/M) samples $x_{mn}[l]$ (m=0 . . . M-1, n=0 . . . N/M-1), these samples may be processed in parallel by the coherent averaging block in one clock cycle. The index l may be a value between 0 and L-1, where L is the length of the coherent average, and may repeat periodically. When the content of the input shift register has been processed, the coherent averaging-based spur cancellation system may wait for the array index to be k=0 to load N/M consecutive arrays x[k] of input samples into the shift register in N/M clock cycles. As a result, a periodic signal of period $T=1/\Delta f\cdot N\cdot D/F_S$ may be ensured to always be sampled at the same starting point, therefore allowing the use of coherent averaging to remove the effect of noise and wanted signals on the spur estimation.

In some implementations, the coherent averaging block may have a matrix of M×(N/M) filter cells. Each filter cell may work with only one element of the $x_{mn}[l]$ matrix, implementing an average of L samples using an accumulator. The accumulator may be reset every L output samples for a new average to be calculated. An output may be scaled by $L^{-1}$ and down-sampled by L to obtain the coherent average $c_{mn}[p]$.

In some implementations, an FPGA digital signal processor (DSP)-48 cell may allow an implementation of a 48-bit accumulator. In this case, only 47 bits may be fed back into the accumulator input because the output of the adder is 48 bits. The input to the accumulator may be converted into a 47-bit number by padding with zeros above the original most significant bit (MSB). As an example, when L is a power of two (e.g., $L=2^\alpha$), then the output scaling may be implemented by simply retaining bits α to α+15 of the accumulator's output and discarding bits 0 to α-1 and α+16 to 47.

In some implementations, when a new correction is available, an update correction signal may be asserted, and the new time-domain correction $C_{mn}[p]$ may be stored in a circular buffer as NIM arrays of M samples c[k]. Further, c[k] may be applied continuously until c[k] becomes obsolete. The update correction signal may be used to hold the last correction if desired. For the correction to be valid, the coherent averaging-based spur cancellation system may ensure that the array index is identical at the two inputs of the adder, which may be a requirement to use coherent averaging. Further, the zero block may allow to apply no correction.

As indicated above, FIG. 4 is provided as an example. Other examples may differ from what is described with regard to FIG. 4. The number and arrangement of devices shown in FIG. 4 are provided as an example. In practice, there may be additional devices, fewer devices, different devices, or differently arranged devices than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) shown in FIG. 4 may perform one or more functions described as being performed by another set of devices shown in FIG. 4.

Figure 5:
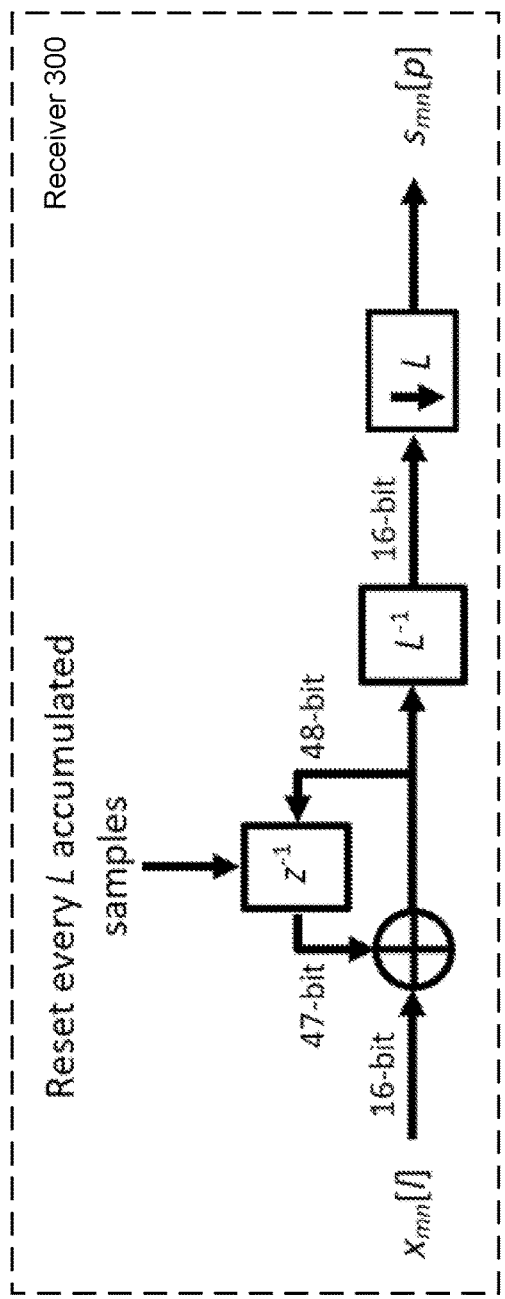
FIG. 5 is a diagram of an example implementation associated with a coherent average filter cell.

FIG. 5 is a diagram of an example implementation 500 associated with a coherent average filter cell. The coherent average filter cell may be included in the receiver (e.g., receiver 300) of the network test device, which is described in more detail below in connection with FIG. 9 and FIG. 10.

As shown in FIG. 5, the coherent average filter cell may work with only one element of an $x_{mn}[l]$ matrix, and may implement an average of L samples using an accumulator. The accumulator may be reset every L output samples for a new average to be calculated. An output may be scaled by L-1 and down-sampled by L to obtain $s_{mn}[p]$, which may be used to obtain the coherent average $C_{mn}[p]$. In some implementations, only 47 bits may be fed back into the accumulator input because the output of an adder is 48-bit. The input to the accumulator must be converted into a 47-bit number by padding with zeros above an original MSB.

As indicated above, FIG. 5 is provided as an example. Other examples may differ from what is described with regard to FIG. 5. The number and arrangement of devices shown in FIG. 5 are provided as an example. In practice, there may be additional devices, fewer devices, different devices, or differently arranged devices than those shown in FIG. 5. Furthermore, two or more devices shown in FIG. 5 may be implemented within a single device, or a single device shown in FIG. 5 may be implemented as multiple, distributed devices. Additionally, or alternatively, a set of devices (e.g., one or more devices) shown in FIG. 5 may perform one or more functions described as being performed by another set of devices shown in FIG. 5.

In some implementations, regarding an iteration time to calculate a spur collection, given N and M, a total of NIM clock cycles may be used to load the input shift register each time. L sets of $x_F+[m,n]$ input shift register data may be processed by parallel filters. A circular buffer may be populated in N/M clock cycles, which may mean that the iteration time $\tau_L$ for a given value of L is:

$$\tau_L = (L+1)\cdot \frac{N}{M}\cdot \frac{D\cdot M}{F_S} \cong \frac{L\cdot N\cdot D}{F_S} \qquad \text{Eq. 11}$$

In some implementations, regarding the coherent average length (L) and the number of residual tones (N), the length L of the average may be chosen to remove influences of other signals on the calculated spur correction. In some implementations, $x_{mn}[l]$ may be written as:

$$x_{mn}[l] = s_{mn} + u_{mn}[l] \qquad \text{Eq. 12}$$

where s may be the spurious signal to be found (which is assumed to be independent of l over the coherent average length), and u may be the contribution from noise and the wanted signal. Assuming that u is a random signal which may be considered stationary over a period of L·N samples, and that u has zero mean and power Pu, then its variance is:

$$\langle |u_{mn}[l]|^2 \rangle = P_u \qquad \text{Eq. 13}$$

In some implementations, u may be reasonably modeled as white noise, especially in modern communication systems based on orthogonal frequency division multiplexing (OFDM). The output of the coherent average filter $c_{mn}[p]$ may be:

$$c_{mn}[p] = \frac{1}{L}\sum_{l=0}^{L-1} x_{mn}[l] = s_{mn} + \frac{1}{L}\sum_{l=0}^{L-1} u_{mn}[l] \qquad \text{Eq. 14}$$

An estimation error signal e may be defined as:

$$e_{mn}[p] = c_{mn}[p] - s_{mn} = \frac{1}{L}\sum_{l=0}^{L-1} u_{mn}[l] \qquad \text{Eq. 15}$$

which may have mean and variance given by:

$$\langle e_{mn}[p]\rangle = \langle u_{mn}[l]\rangle = 0 \qquad \text{Eq. 16}$$

and $$P_e = \langle |e_{mn}[p]|^2\rangle = \frac{\langle |u_{mn}[l]|^2\rangle}{L} = \frac{P_u}{L} \qquad \text{Eq. 17}$$

Equation 18, Equation 19, and Equation 20 may indicate that e is also zero-mean white noise, and its power $P_e$ is L times smaller than $P_u$.

In some implementations, the spectral distribution of e may be determined in order to understand the effect on the performance of the coherent averaging-based spur cancellation system. Since c[k] may be applied continuously until a new correction becomes available, when L>>1, the effect of the error signal e on the output may be considered periodic with a period of N samples, which may allow a discrete Fourier transform (DFT) to be used to analyze the spectral distribution of e, and which may consist of N residual tones at harmonics of Δf (e.g., as indicated by Equation 5).

In some implementations, since e may be a random signal, its DFT E and, therefore, the distribution of $P_e$ across the N residual tones, may also be random variables. As an example, in an analysis involving a total of 1000 DFTs of N=32, 64, 128, and 256 of zero-mean white noise with uniform distribution (e.g., the distribution of the estimation error power $P_e$ across the N residual tones for 1000 iterations), the power of each residual tone averaged across all the DFTs $P_{tone,avg}$ may be:

$$P_{tone,avg} = \frac{P_e}{N} = \frac{P_u}{L \cdot N} \qquad \text{Eq. 18}$$

which may mean that the effect of the estimation error may be mitigated by spreading $P_e$ across a larger number of residual tones N in the frequency domain, where the mean residual tone power may be 15 dB, 18 dB, 21 dB, and 24 dB below $P_e$ for N=32, 64, 128, and 256, respectively. The peak residual tone power may typically be 6 dB, 9 dB, 12 dB, and 15 dB below $P_e$ for those same values of N. Exceeding these typical peak values may be less common as the value of N increases. Further, increasing N may also reduce the frequency error resulting from the frequency planning, which may be corrected digitally, and which may allow for relaxation of the requirements on the analog circuitry. However, a larger N may require more digital resources to be implemented.

In some implementations, the receiver may be designed such that the noise floor of the RF ADC is 10 dB below the overall noise floor of the receiver. For example, for a representative RF ADC noise floor $N_{ADC}$=−147.5 dBFS/Hz, the noise floor of the receiver may be $N_{RX}$=−137.5 dBFS/Hz. The minimum subcarrier bandwidth may be 15 kHz when working with Fifth Generation (5G) New Radio (NR) OFDM signals, such that the noise power per subcarrier may be $N_{sc}$=−95.7 decibels relative to full scale (dBFS). A reasonable back-off from full-scale for the RF ADC may be 15 dB to optimize an error vector magnitude (EVM). In such conditions, the maximum RF ADC input power may be $P_u$=−15 dBFS. Equation 14 and Equation 21 may be used to calculate L and N to achieve a certain value of residual tone power relative to the noise power per subcarrier $P_{tone}/N_{sc}$ (dB), and the corresponding iteration time $\tau_L$. With a 48-bit accumulator size and a 16-bit input, a maximum bit growth of 32 bits may be possible, which may mean that α≤32.

FIG. 6 is a diagram of an example implementation 600 associated with calculating a coherent average length and a number of residual tones.

As shown in FIG. 6, the coherent average length (L) and the number of residual tones (N) may be calculated to achieve a certain value of residual tone power relative to the noise power per subcarrier $P_{tone}/N_{sc}$ (dB), and the corresponding iteration time $\tau_L$. The coherent average length may be calculated for N=64 and N=32 when $F_S/D$=1500 MSPS and 500 MSPS, respectively. The coherent average length and the number of residual tones may be calculated to minimize the effect of other signals on the spur estimation, when assuming a subcarrier spacing (SCS) of 15 kHz.

As indicated above, FIG. 6 is provided as an example. Other examples may differ from what is described with regard to FIG. 6.

In some implementations, the coherent average filter cell may be an efficient way to remove the effect of noise and wanted signals on the calculation of the spur correction. However, latency may be involved in accumulating $L=2^\alpha$ samples. In some implementations, the latency may be reduced by adding a first-order low-pass infinite impulse response (IIR) stage. In this case, the coherent average filter cell may act as a decimation by L stage, which may allow implementation of the low-pass IIR filter with realizable ay values. As a result, using IIR filters may result in a response time improvement, as compared to using the moving average filter cell.

Figure 7:
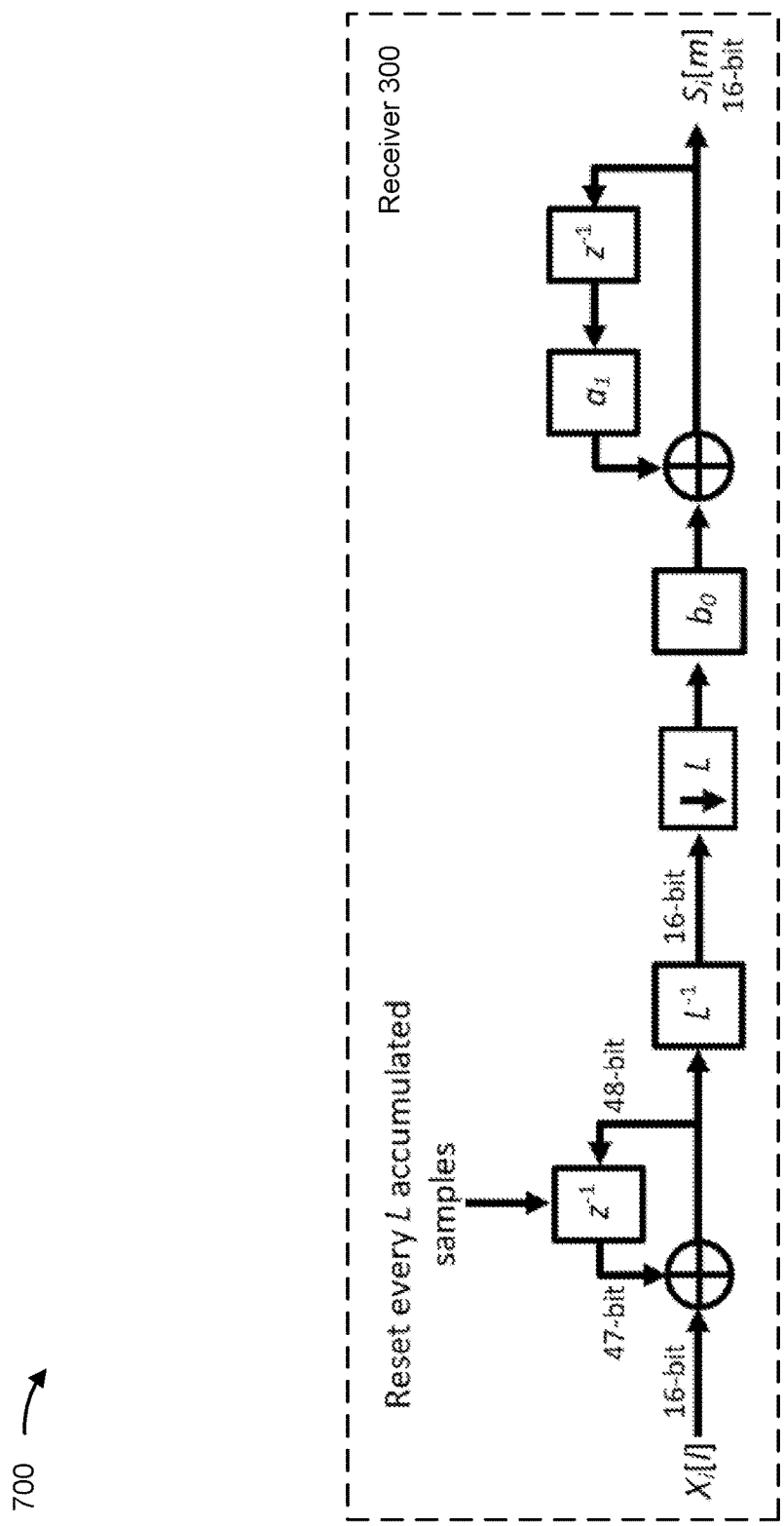
FIG. 7 is a diagram of an example implementation associated with a filter cell that incorporates a first-order low-pass infinite impulse response (IIR) stage.

FIG. 7 is a diagram of an example implementation 700 associated with a filter cell that incorporates a first-order low-pass IIR stage. The filter cell may be included in the receiver (e.g., receiver 300) of the network test device, which is described in more detail below in connection with FIG. 9 and FIG. 10.

As shown in FIG. 7, the filter cell may include the first-order low-pass IIR stage to reduce latency. A moving average may act as a decimation by L stage, which may allow for implementation of the low-pass IIR filter with realizable $\alpha_1$ values. In some implementations, the frequency response of the IIR stage $H_{IIR}(e^{j\Omega})$ may be:

$$H_{IIR}(e^{j\Omega}) = \frac{b_0}{1 - e^{-j\Omega}a_1} \qquad \text{Eq. 19}$$

and $b_0=1-\alpha_1$ may be needed for unity gain when $\Omega=0$. The IIR stage may enable use of smaller values of L, therefore improving the update rate of the parallel filters, as compared with using just the moving average. However, resource utilization may be greater than with a simple accumulator, which may be problematic with relatively large values of N.

As indicated above, FIG. 7 is provided as an example. Other examples may differ from what is described with regard to FIG. 7. The number and arrangement of devices shown in FIG. 7 are provided as an example. In practice, there may be additional devices, fewer devices, different devices, or differently arranged devices than those shown in FIG. 7. Furthermore, two or more devices shown in FIG. 7 may be implemented within a single device, or a single device shown in FIG. 7 may be implemented as multiple, distributed devices. Additionally, or alternatively, a set of devices (e.g., one or more devices) shown in FIG. 7 may perform one or more functions described as being performed by another set of devices shown in FIG. 7.

Figure 8:
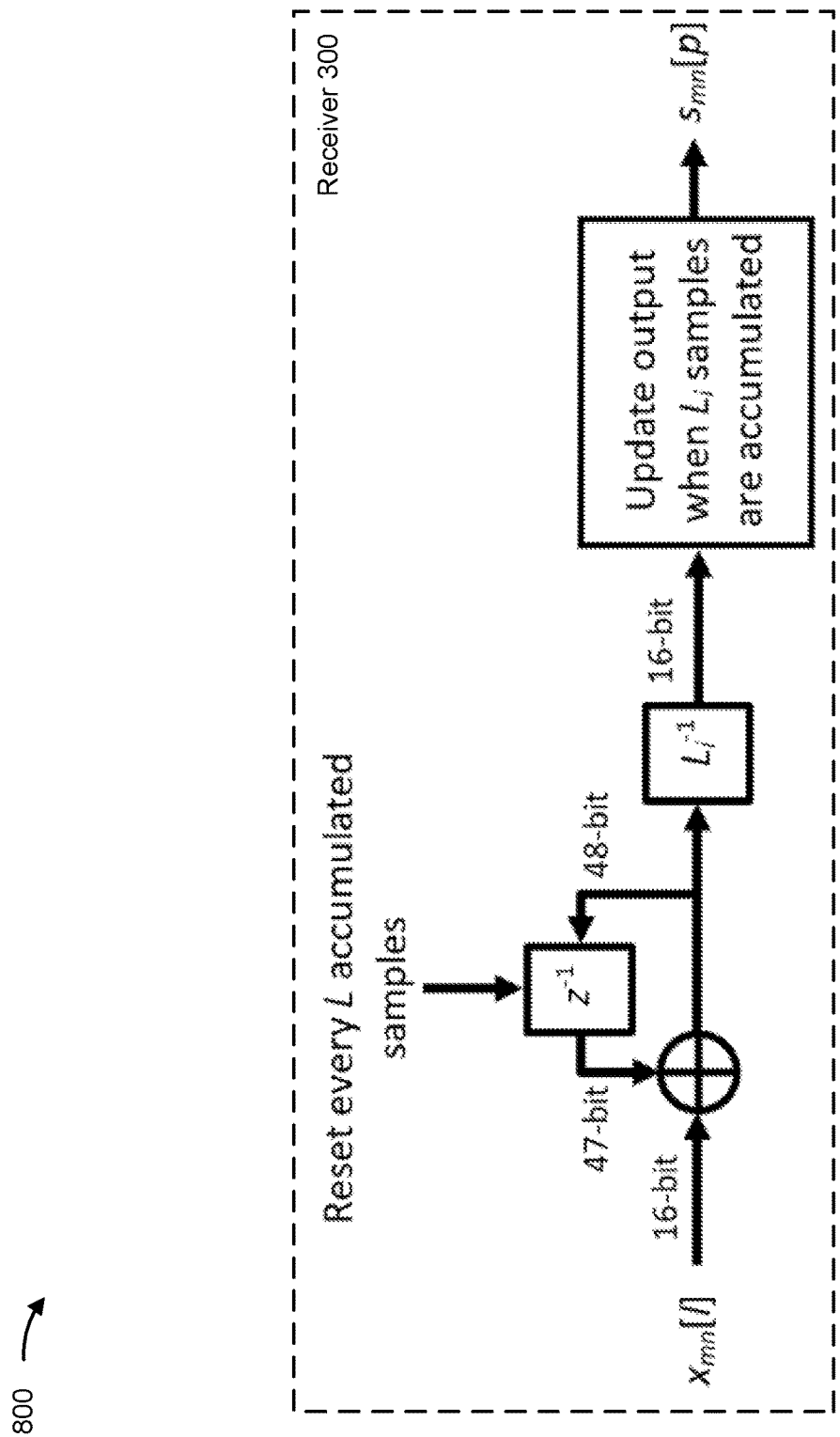
FIG. 8 is a diagram of an example implementation associated with a filter cell using intermediate accumulator results of a first iteration.

FIG. 8 is a diagram of an example implementation 800 associated with a filter cell using intermediate accumulator results of a first iteration. The filter cell may be included in the receiver (e.g., receiver 300) of the network test device, which is described in more detail below in connection with FIG. 9 and FIG. 10.

As shown in FIG. 8, in order to reduce the time until an initial correction becomes available, the intermediate accumulator results of the first iteration may be used. For example, during the first iteration of the accumulator, $S_{mn}[p]$ may be updated when the number of accumulated samples is $L_i=2^{i\cdot\sigma}$ (where i=1 . . . Q is the intermediate step index, $\sigma=\alpha/Q$ and Q is an integer number) instead of $L=2^\alpha$. An output of the accumulator may be normalized by $L_i$ instead of L. The normalization may be implemented efficiently by selecting which bits of the accumulator output are retained. At each intermediate step, the spur correction accuracy may be improved because more samples are accumulated in total. After the first iteration, the correction may only be updated every $L=2^\alpha$ accumulated samples. The accumulator may be reset every L accumulated samples despite the usage of intermediate results during the first iteration.

As indicated above, FIG. 8 is provided as an example. Other examples may differ from what is described with regard to FIG. 8. The number and arrangement of devices shown in FIG. 8 are provided as an example. In practice, there may be additional devices, fewer devices, different devices, or differently arranged devices than those shown in FIG. 8. Furthermore, two or more devices shown in FIG. 8 may be implemented within a single device, or a single device shown in FIG. 8 may be implemented as multiple, distributed devices. Additionally, or alternatively, a set of devices (e.g., one or more devices) shown in FIG. 8 may perform one or more functions described as being performed by another set of devices shown in FIG. 8.

In some implementations, the coherent averaging spur cancellation technique, as described herein, may be evaluated using parallel filters based on a coherent average filter cell. As an example, the coherent averaging spur cancellation technique, as described herein, may be evaluated with $\alpha=21$, $F_S=6000$ MSPS, D=4, and N=64. The ADC NCO and transmit and receive LO frequencies may be configured as integer multiples of $\Delta f=23.4375$ MHz. The coherent averaging spur cancellation technique may be successful in removing spurs, even in the presence of a strong continuous wave wanted signal.

Figure 9:
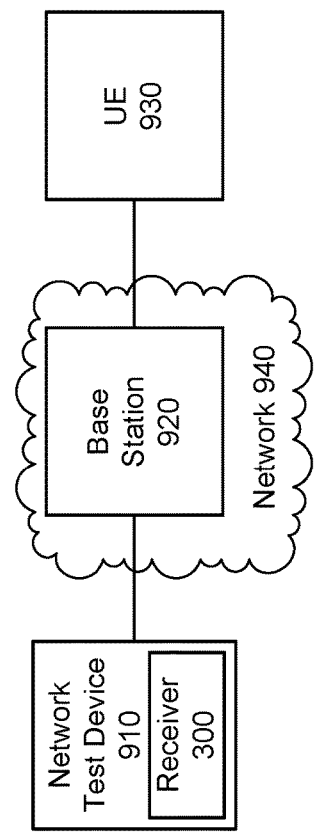
FIG. 9 is a diagram of an example environment in which systems and/or methods described herein may be implemented.

FIG. 9 is a diagram of an example environment 900 in which systems and/or methods described herein may be implemented. As shown in FIG. 9, environment 900 may include a network test device 910 having a receiver 300, a base station 920, a user equipment (UE) 930, and a network 940. Devices of environment 900 may interconnect via wired connections, wireless connections, or a combination of wired and wireless connections.

Network test device 910 includes one or more devices capable of communicating with base station 920 and/or a network (e.g., network 940), such as to perform processing of a signal produced by base station 920. Network test device 910 may communicate with base station 920 by a wired connection, as described elsewhere herein. In some implementations, network test device 910 may wirelessly communicate with base station 920.

Network test device 910 may include a beamforming network, a feedback component, and/or a test component as described elsewhere herein. The beamforming network may include an analog beamforming network that outputs a signal associated with a beam direction, as described elsewhere herein. The feedback component may include a passive RF component, such as an RF coupler, that outputs a feedback signal based on an output signal of the beamforming network or a calibration signal of a calibration component of the base station 920, as described elsewhere herein. The test component may include one or more devices capable of receiving, generating, storing, processing, and/or providing information associated with a signal, such as an RF signal (e.g., an output signal of the beamforming network). For example, the test component may include a communication and/or computing device, such as a mobile phone (e.g., a smart phone, a radiotelephone, etc.), a laptop computer, a tablet computer, a handheld computer, a desktop computer, a gaming device, a wearable communication device (e.g., a smart wristwatch, a pair of smart eyeglasses, etc.), or a similar type of device.

Base station 920 includes one or more devices capable of communicating with a UE using a cellular radio access technology (RAT). For example, base station 920 may include a base transceiver station, a radio base station, a node B, an evolved node B (eNB), a gNB, a base station subsystem, a cellular site, a cellular tower (e.g., a cell phone tower or a mobile phone tower), an access point, a transmit receive point (TRP), a radio access node, a macro cell base station, a microcell base station, a picocell base station, a femtocell base station, or a similar type of device. Base station 920 may transfer traffic between a UE (e.g., using a cellular RAT), other base stations 920 (e.g., using a wireless interface or a backhaul interface, such as a wired backhaul interface), and/or network 940. Base station 920 may provide one or more cells that cover geographic areas. Some base stations 920 may be mobile base stations. Some base stations 920 may be capable of communicating using multiple RATs.

In some implementations, base station 920 may perform scheduling and/or resource management for UEs covered by base station 920 (e.g., UEs covered by a cell provided by base station 920). In some implementations, base stations 920 may be controlled or coordinated by a network controller, which may perform load balancing and/or network-level configuration. The network controller may communicate with base stations 920 via a wireless or wireline backhaul. In some implementations, base station 920 may include a network controller, a self-organizing network (SON) module or component, or a similar module or component. In other words, a base station 920 may perform network control, scheduling, and/or network management functions (e.g., for other base stations 920 and/or for uplink, downlink, and/or sidelink communications of UEs covered by the base station 920). In some implementations, base station 920 may include a central unit and multiple distributed units. The central unit may coordinate access control and communication with regard to the multiple distributed units. The multiple distributed units may provide UEs and/or other base stations 920 with access to network 940.

In some implementations, base station 920 may be capable of multiple-input multiple-output (MIMO) communication (e.g., beamformed communication). In some implementations, base station 920 may include a calibration component for phase calibration of signals produced or received by base station 920, as described elsewhere herein. In a testing scenario, one or more antenna elements (e.g., an antenna array) of base station 920 may be disconnected, and base station 920 may be connected to a test panel, as described elsewhere herein.

UE 930 may include one or more devices capable of communicating with base station 920 and/or a network (e.g., network 940). For example, UE 930 may include a wireless communication device, a radiotelephone, a personal communications system (PCS) terminal (e.g., that may combine a cellular radiotelephone with data processing and data communications capabilities), a smart phone, a laptop computer, a tablet computer, a personal gaming system, user equipment, and/or a similar device. UE 930 may be capable of communicating using uplink (e.g., UE to base station) communications, downlink (e.g., base station to UE) communications, and/or sidelink (e.g., UE-to-UE) communications. In some implementations, UE 930 may include a machine-type communication (MTC) UE, such as an evolved or enhanced MTC (eMTC) UE. In some implementations, UE 930 may include an Internet of Things (IoT) UE, such as a narrowband IoT (NB-IoT) UE.

Network 940 includes one or more wired and/or wireless networks. For example, network 940 may include a cellular network (e.g., a long-term evolution (LTE) network, a code division multiple access (CDMA) network, a 3G network, a 4G network, a 5G network, or another type of next generation network), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, and/or a combination of these or other types of networks.

The quantity and arrangement of devices and networks shown in FIG. 9 are provided as one or more examples. In practice, there may be additional devices and/or networks, fewer devices and/or networks, different devices and/or networks, or differently arranged devices and/or networks than those shown in FIG. 9. Furthermore, two or more devices shown in FIG. 9 may be implemented within a single device, or a single device shown in FIG. 9 may be implemented as multiple, distributed devices. Additionally, or alternatively, a set of devices (e.g., one or more devices) of environment 900 may perform one or more functions described as being performed by another set of devices of environment 900.

Figure 10:
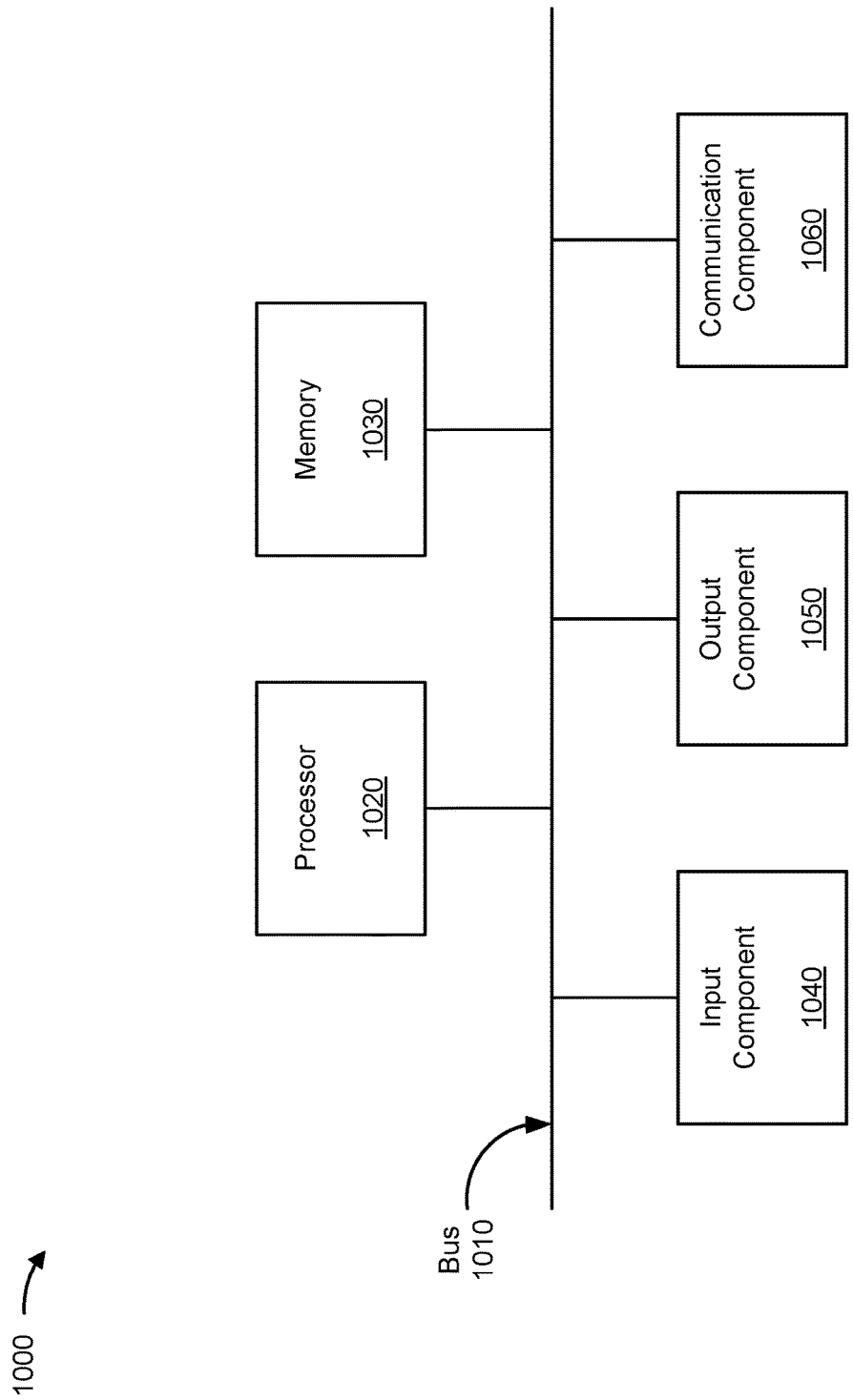
FIG. 10 is a diagram of example components of a device 1000 associated with attenuating continuous wave spurs associated with a receiver.

FIG. 10 is a diagram of example components of a device 1000 associated with attenuating continuous wave spurs associated with a receiver. The device 1000 may correspond to a network test device (e.g., network test device 910). In some implementations, the network test device may include one or more devices 1000 and/or one or more components of the device 1000. As shown in FIG. 10, the device 1000 may include a bus 1010, a processor 1020, a memory 1030, an input component 1040, an output component 1050, and/or a communication component 1060.

The bus 1010 may include one or more components that enable wired and/or wireless communication among the components of the device 1000. The bus 1010 may couple together two or more components of FIG. 10, such as via operative coupling, communicative coupling, electronic coupling, and/or electric coupling. For example, the bus 1010 may include an electrical connection (e.g., a wire, a trace, and/or a lead) and/or a wireless bus. The processor 1020 may include a central processing unit, a graphics processing unit, a microprocessor, a controller, a microcontroller, a digital signal processor, a field-programmable gate array, an application-specific integrated circuit, and/or another type of processing component. The processor 1020 may be implemented in hardware, firmware, or a combination of hardware and software. In some implementations, the processor 1020 may include one or more processors capable of being programmed to perform one or more operations or processes described elsewhere herein.

The memory 1030 may include volatile and/or nonvolatile memory. For example, the memory 1030 may include random access memory (RAM), read only memory (ROM), a hard disk drive, and/or another type of memory (e.g., a flash memory, a magnetic memory, and/or an optical memory). The memory 1030 may include internal memory (e.g., RAM, ROM, or a hard disk drive) and/or removable memory (e.g., removable via a universal serial bus connection). The memory 1030 may be a non-transitory computer-readable medium. The memory 1030 may store information, one or more instructions, and/or software (e.g., one or more software applications) related to the operation of the device 1000. In some implementations, the memory 1030 may include one or more memories that are coupled (e.g., communicatively coupled) to one or more processors (e.g., processor 1020), such as via the bus 1010. Communicative coupling between a processor 1020 and a memory 1030 may enable the processor 1020 to read and/or process information stored in the memory 1030 and/or to store information in the memory 1030.

The input component 1040 may enable the device 1000 to receive input, such as user input and/or sensed input. For example, the input component 1040 may include a touch screen, a keyboard, a keypad, a mouse, a button, a microphone, a switch, a sensor, a global positioning system sensor, an accelerometer, a gyroscope, and/or an actuator. The output component 1050 may enable the device 1000 to provide output, such as via a display, a speaker, and/or a light-emitting diode. The communication component 1060 may enable the device 1000 to communicate with other devices via a wired connection and/or a wireless connection. For example, the communication component 1060 may include a receiver, a transmitter, a transceiver, a modem, a network interface card, and/or an antenna.

The device 1000 may perform one or more operations or processes described herein. For example, a non-transitory computer-readable medium (e.g., memory 1030) may store a set of instructions (e.g., one or more instructions or code) for execution by the processor 1020. The processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry may be used instead of or in combination with the instructions to perform one or more operations or processes described herein. Additionally, or alternatively, the processor 1020 may be configured to perform one or more operations or processes described herein. Thus, implementations described herein are not limited to any specific combination of hardware circuitry and software.

The number and arrangement of components shown in FIG. 10 are provided as an example. The device 1000 may include additional components, fewer components, different components, or differently arranged components than those shown in FIG. 10. Additionally, or alternatively, a set of components (e.g., one or more components) of the device 1000 may perform one or more functions described as being performed by another set of components of the device 1000.

Figure 11:
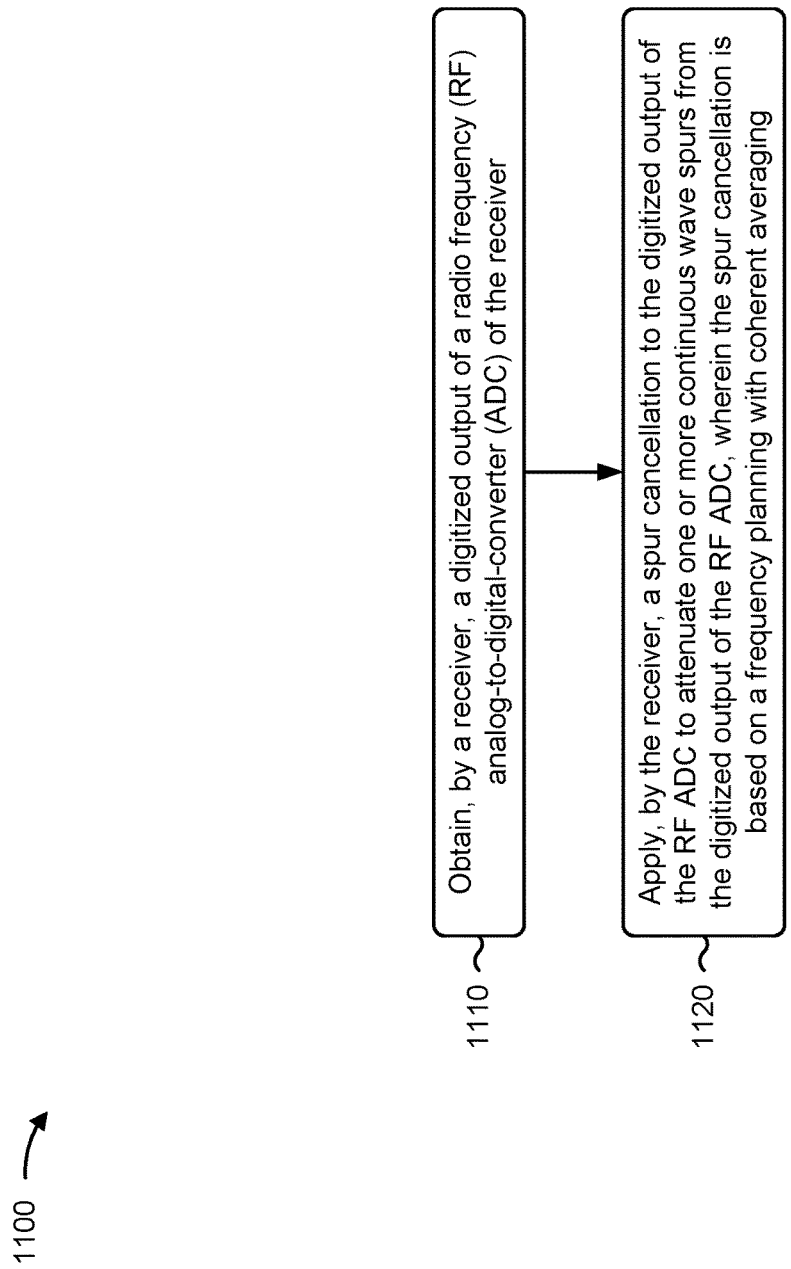
FIG. 11 is a flowchart of an example process associated with attenuating continuous wave spurs associated with a receiver.

FIG. 11 is a flowchart of an example process 1100 associated with attenuating continuous wave spurs associated with a receiver. In some implementations, one or more process blocks of FIG. 11 may be performed by a receiver (e.g., receiver 300). In some implementations, one or more process blocks of FIG. 11 may be performed by another device or a group of devices separate from or including the receiver, such as a network test device (e.g., network test device 910). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include obtaining a digitized output of an RF ADC of the receiver (block 1110). For example, the receiver may obtain a digitized output of an RF ADC of the receiver, as described above.

As further shown in FIG. 11, process 1100 may include applying a spur cancellation to the digitized output of the RF ADC to attenuate one or more continuous wave spurs from the digitized output of the RF ADC, wherein the spur cancellation is based on a frequency planning with coherent averaging (block 1120). For example, the receiver may apply a spur cancellation to the digitized output of the RF ADC to attenuate one or more continuous wave spurs from the digitized output of the RF ADC, wherein the spur cancellation is based on a frequency planning with coherent averaging, as described above.

In some implementations, the frequency planning is for a first reference clock, a second reference clock, a transmit LO, a receive LO, and an NCO of the RF ADC that causes corresponding signals to be integer multiples of a frequency bin, and the frequency bin is based on a sampling frequency, an ADC decimation factor, and an integer number. In some implementations, the one or more continuous wave spurs become a periodic signal based on the frequency planning, and the spur cancellation is applied based on the periodic signal without information regarding exact frequency values of the first reference clock, the second reference clock, the transmit LO, the receive LO, and the NCO of the RF ADC. In some implementations, a frequency error resulting from the frequency planning is compensated by a digital frequency conversion using an NCO frequency value.

In some implementations, a coherent average technique is used to measure a complex amplitude of the one or more continuous wave spurs and to apply a time-domain correction signal in counterphase to remove the one or more continuous wave spurs from the digitized output of the RF ADC. In some implementations, a shift register of the receiver is loaded with a matrix of samples and processed in parallel using the coherent averaging, wherein a coherent averaging block of the receiver includes a matrix of coherent average filters where each coherent average filter implements an average of L samples using an accumulator and the accumulator is reset every L output samples for time-domain correction information to be obtained, and wherein an update correction signal is asserted based on the time-domain correction information being available and the time-domain correction information is stored in a circular buffer of the receiver. In some implementations, the spur cancellation is based on one or more of a coherent average filter, a first-order low-pass IIR filter, or intermediate accumulator results of an iteration.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method, comprising:
obtaining, by a receiver, a digitized output of a radio frequency (RF) analog-to-digital-converter (ADC) of the receiver; and
applying, by the receiver, a spur cancellation to the digitized output of the RF ADC to attenuate one or more continuous wave spurs from the digitized output of the RF ADC, wherein the spur cancellation is based on a frequency planning with coherent averaging, wherein the frequency planning is for a first reference clock, a second reference clock, a transmit local oscillator (LO), a receive LO, and a numerically controlled oscillator (NCO) of the RF ADC that causes corresponding signals to be integer multiples of a frequency bin, and wherein the frequency bin is based on a sampling frequency, an ADC decimation factor, and an integer number.

2. The method of claim 1, wherein the one or more continuous wave spurs become a periodic signal based on the frequency planning, and wherein the spur cancellation is applied based on the periodic signal without information regarding exact frequency values of the first reference clock, the second reference clock, the transmit LO, the receive LO, and the NCO of the RF ADC.

3. The method of claim 1, wherein a frequency error resulting from the frequency planning is compensated by a digital frequency conversion using an NCO frequency value.

4. The method of claim 1, wherein a coherent averaging technique is used to measure a complex amplitude of the one or more continuous wave spurs and to apply a time-domain correction signal in counterphase to remove the one or more continuous wave spurs from the digitized output of the RF ADC.

5. The method of claim 1, wherein a shift register of the receiver is loaded with a matrix of samples and processed in parallel using the coherent averaging, wherein a coherent averaging block of the receiver includes a matrix of coherent average filters where each coherent average filter implements an average of L samples using an accumulator and the accumulator is reset every L output samples for time-domain correction information to be obtained, and wherein an update correction signal is asserted based on the time-domain correction information being available and the time-domain correction information is stored in a circular buffer of the receiver.

6. The method of claim 1, wherein the spur cancellation is based on one or more of: a coherent average filter, a first-order low-pass infinite impulse response (IIR) filter, or intermediate accumulator results of an iteration.

7. The method of claim 1, wherein the receiver is associated with a network test device.

8. A device, comprising:
one or more components configured to:
obtain a digitized output of a radio frequency (RF) analog-to-digital-converter (ADC) of the device; and
apply a spur cancellation to the digitized output of the RF ADC to attenuate one or more continuous wave spurs from the digitized output of the RF ADC, wherein the spur cancellation is based on a frequency planning with coherent averaging, wherein the frequency planning is for a first reference clock, a second reference clock, a transmit local oscillator (LO), a receive LO, and a numerically controlled oscillator (NCO) of the RF ADC that causes corresponding signals to be integer multiples of a frequency bin, and wherein the frequency bin is based on a sampling frequency, an ADC decimation factor, and an integer number.

9. The device of claim 8, wherein the one or more continuous wave spurs become a periodic signal based on the frequency planning, and wherein the spur cancellation is applied based on the periodic signal without information regarding exact frequency values of the first reference clock, the second reference clock, the transmit LO, the receive LO, and the NCO of the RF ADC.

10. The device of claim 8, wherein a frequency error resulting from the frequency planning is compensated by a digital frequency conversion using an NCO frequency value.

11. The device of claim 8, wherein a coherent averaging technique is used to measure a complex amplitude of the one or more continuous wave spurs and to apply a time-domain correction signal in counterphase to remove the one or more continuous wave spurs from the digitized output of the RF ADC.

12. The device of claim 8, wherein a shift register of the device is loaded with a matrix of samples and processed in parallel using coherent averaging, wherein a coherent averaging block of the device includes a matrix of coherent average filters where each coherent average filter implements an average of L samples using an accumulator and the accumulator is reset every L output samples for time-domain correction information to be obtained, and wherein an update correction signal is asserted based on the time-domain correction information being available and the time-domain correction information is stored in a circular buffer of the device.

13. The device of claim 8, wherein the spur cancellation is based on one or more of: a coherent average filter, a first-order low-pass infinite impulse response (IIR) filter, or intermediate accumulator results of an iteration.

14. The device of claim 8, wherein the device is associated with a network test device.

15. A non-transitory computer-readable medium storing a set of instructions, the set of instructions comprising:
one or more instructions that, when executed by one or more processors of a receiver, cause the receiver to:
obtain a digitized output of a radio frequency (RF) analog-to-digital-converter (ADC) of the receiver; and
apply a spur cancellation to the digitized output of the RF ADC to attenuate one or more continuous wave spurs from the digitized output of the RF ADC, wherein the spur cancellation is based on a frequency planning with coherent averaging, wherein the frequency planning is for a first reference clock, a second reference clock, a transmit local oscillator (LO), a receive LO, and a numerically controlled oscillator (NCO) of the RF ADC that causes corresponding signals to be integer multiples of a frequency bin, and wherein the frequency bin is based on a sampling frequency, an ADC decimation factor, and an integer number.

16. The non-transitory computer-readable medium of claim 15, wherein the one or more continuous wave spurs become a periodic signal based on the frequency planning, and wherein the spur cancellation is applied based on the periodic signal without information regarding exact frequency values of the first reference clock, the second reference clock, the transmit LO, the receive LO, and the NCO of the RF ADC.

17. The non-transitory computer-readable medium of claim 15, wherein a coherent averaging technique is used to measure a complex amplitude of the one or more continuous wave spurs and to apply a time-domain correction signal in counterphase to remove the one or more continuous wave spurs from the digitized output of the RF ADC.

18. The non-transitory computer-readable medium of claim 15, wherein a shift register of the receiver is loaded with a matrix of samples and processed in parallel using the coherent averaging, wherein a coherent averaging block of the receiver includes a matrix of coherent average filters where each coherent average filter implements an average of L samples using an accumulator and the accumulator is reset every L output samples for time-domain correction information to be obtained, and wherein an update correction signal is asserted based on the time-domain correction information being available and the time-domain correction information is stored in a circular buffer of the receiver.

19. The non-transitory computer-readable medium of claim 15, wherein the spur cancellation is based on one or more of: a coherent average filter, a first-order low-pass infinite impulse response (IIR) filter, or intermediate accumulator results of an iteration.

20. The non-transitory computer-readable medium of claim 15, wherein the receiver is associated with a network test device.

* * * * *